(12) United States Patent
Hsu et al.

(10) Patent No.: US 7,005,749 B2
(45) Date of Patent: Feb. 28, 2006

(54) FLIP CHIP PACKAGE STRUCTURE

(75) Inventors: Hung-Ta Hsu, Kaohsiung (TW);
Tzu-Bin Lin, Kaohsiung (TW);
Ya-Ling Huang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/899,870

(22) Filed: Jul. 27, 2004

(65) Prior Publication Data

US 2005/0029672 A1    Feb. 10, 2005

(30) Foreign Application Priority Data

Aug. 7, 2003    (TW) ............................... 92121729 A

(51) Int. Cl.
*H01L 23/12*    (2006.01)
(52) U.S. Cl. ...................................... 257/778; 438/108
(58) Field of Classification Search ................ 257/778, 257/782, 783, 795, 737, 738; 438/108
See application file for complete search history.

(56) References Cited

U.S. PATENT DOCUMENTS 6,507,119 B1 *    1/2003   Huang et al. ................ 257/778
2004/0188814 A1 *  9/2004   Houle et al. ................ 257/678

* cited by examiner

*Primary Examiner*—David Nelms
*Assistant Examiner*—Quoc Hoang
(74) *Attorney, Agent, or Firm*—Thomas, Kayden, Horstemeyer & Risley, LLP

(57) ABSTRACT

A flip chip package structure includes a substrate, a chip, solder bumps, a heat sink, a thermal interface material (TIM), and solder balls. The substrate has an upper surface and a lower surface and further has a receiving area. The receiving area has a bottom in the substrate and an opening formed on the upper surface. Several solder bumps are disposed in the receiving area. The chip is disposed on the upper surface of the substrate, and covers the opening. The front surface of the chip is electrically coupled to the bottom via the solder bumps. The heat sink is attached to the upper surface of the substrate and the back surface of the chip through the adhesion of TIM. Several solder balls are disposed on the lower surface of the substrate.

15 Claims, 3 Drawing Sheets

FLIP CHIP PACKAGE STRUCTURE

This application claims the benefit of Taiwan application Serial No. 92121729, filed Aug. 7, 2003, the subject matter of which is incorporated herein by reference.

BACKGROUND OF THE INVENTION

1. Field of the Invention

The invention relates in general to a package structure, and more particularly to a flip chip package structure.

2. Description of the Related Art

In the past few years, electronic products are developing toward being thin and small, multi-functioned, and high-speed, semiconductor package structures with high density and high output/input are more and more required, so the flip chip package process is increasingly applied instead of the wire bond package process and the tape automated bonding (TAB) package process. The flip chip package process can not only have good electrical features by using less interface bonding paths, but also achieve the requirement of multi-input/output pins since the designer can utilize the space of the chip more effectively.

Referring to FIG. 1, a lateral diagram of the conventional flip chip package structure is shown. Several solder bumps 104, disposed on the front surface 102a of the chip 102 are formed as bonding joints to electrically couple the chip 102 with the substrate in the solder reflow process. Moreover, solder balls 108 are disposed on the lower surface 106b of the substrate 106 for electrically coupling the package structure 100 with the exterior circuits. Underfill materials 110, filled in the region between the chip 102 and the substrate 106 in the underfill process, cover and sustain the solder bumps 104 to improve the bonding strength of the chip 102 and the substrate 106.

In addition, in order to maintain a good operation of the flip chip package structure, a heat sink is provided for releasing heat generated from the chip to the exterior. As shown in FIG. 1, a metal ring 112, encircling the chip 102, is disposed on the upper surface 106a of the substrate 106 for raising the heat sink 114 up, so that the heat sink 114 can be heat-conductively coupled to the back surface 102b of the chip 102. Furthermore, the heat sink 114 can be attached to the back surface 102b of the chip 102 and the upper surface of the metal ring 112 through the adhesion of the thermal interface material (TIM) 116.

Although the underfill technology used in the flip chip package process can solve the issue that bonding joints are damaged by the expanding stress when hot and the shrinking stress when cold, the facts that the flowing time of the underfill materials is difficult to control and the time for underfill material solidification is too long reduce production performance and further lead to a bottleneck of the manufacturing process.

SUMMARY OF THE INVENTION

It is therefore an object of the invention to provide a flip chip package structure. The improved substrate design can enhance the bonding strength of the chip and the substrate, without performing the underfill process. Therefore, the manufacturing cost can be reduced and the production performance can be improved.

The invention achieves the above-identified object by providing a flip chip package structure including a substrate, a chip, solder bumps, a heat sink, a TIM, and solder balls. The substrate has an upper surface and a lower surface and further includes a first receiving area and a second receiving area. The first receiving area, formed at the upper surface, has a first inner wall and a first bottom. The second receiving area, formed at the bottom, has a second inner wall and a second bottom. The chip is disposed in the first receiving area, and a number of solder bumps are disposed in the second receiving area. The front surface of the chip is electrically coupled to the second bottom via the solder bumps. The heat sink is attached to the upper surface of the substrate and the back surface of the chip through the adhesion of TIM. Several solder balls are disposed on the lower surface of the substrate.

The invention achieves the above-identified object by further providing a substrate structure of a flip chip package structure including an upper surface, a lower surface, a first receiving area, and a second receiving area. The lower surface is corresponding to the upper surface in location. The first receiving area, formed at the upper surface, has a first inner wall and a first bottom. The second receiving area, formed at the first bottom, has a second inner wall and a second bottom. The first receiving area is used for containing the chip while the second receiving area used for containing the solder bumps. The front surface of the chip is electrically coupled to the second bottom via the solder bumps.

Other objects, features, and advantages of the invention will become apparent from the following detailed description of the preferred but non-limiting embodiments. The following description is made with reference to the accompanying drawings.

DETAILED DESCRIPTION OF THE INVENTION

The invention provides an improved substrate design to take place of that formed in the underfill process of the conventional flip chip package process. Therefore, the bonding joint damage issue, resulted from expanding stress when hot and shrinking stress when cold, can be solved, and the bonding strength of the chip and the substrate can be enhanced.

Figure 1:
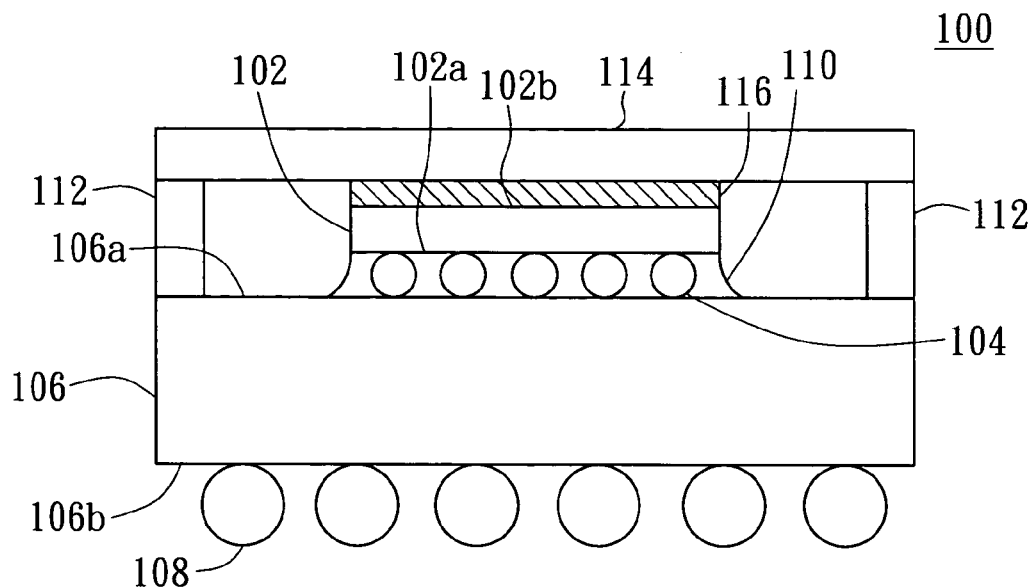
FIG. 1 is a lateral diagram of the conventional flip chip package structure.
Figure 2:
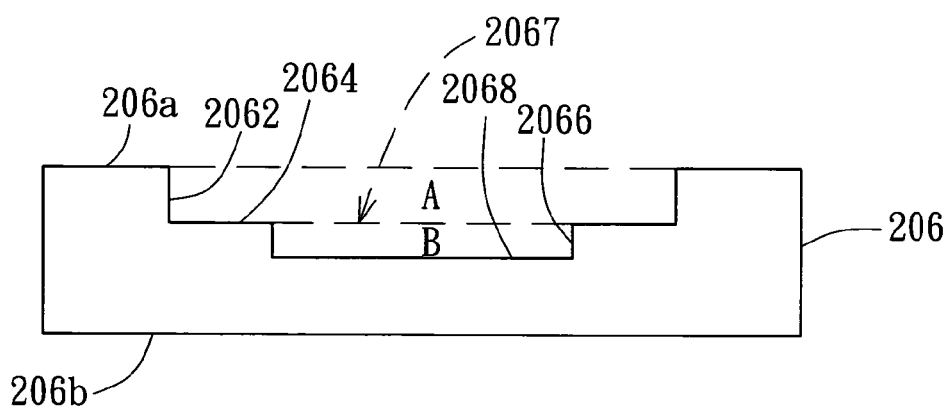
FIG. 2 is a schematic diagram of the substrate structure of the flip chip package structure according to a preferred embodiment of the invention.

Referring to FIG. 2, a schematic diagram of the substrate structure of the flip chip package structure according to a preferred embodiment of the invention is shown. The substrate 206 of the flip chip package structure includes an upper surface 206a, a lower surface 206b, a first receiving area A and a second receiving area B. The upper surface 206a is corresponding to the lower surface 206b in location. The first receiving area A, formed at the upper surface 206a, has a first inner wall 2062, and a first bottom 2064 while the second receiving area B, formed at the first bottom 2064, has a second inner wall 2066 and a second bottom 2068.

Figure 3:
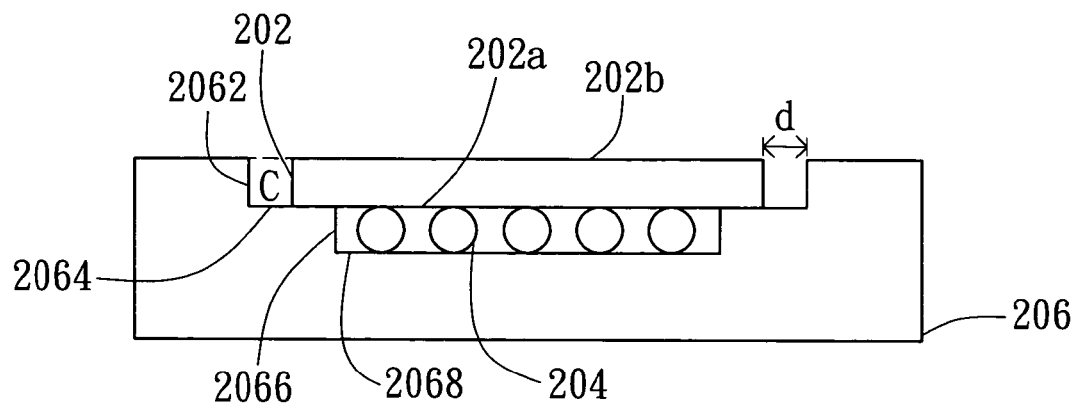
FIG. 3 is a schematic diagram of the substrate structure in FIG. 2, on which a chip is disposed.

Referring to FIG. 3, a schematic diagram of the substrate structure in FIG. 2, on which a chip is disposed, is shown. As illustrated in FIG. 3, the chip 202 is disposed in the first receiving area A and covers the opening 2067 at the first bottom 2064 (as shown in FIG. 2). Several solder bumps 204 are disposed on the front surface 202a of the chip 202. When the chip 202 is disposed on the substrate 206, the solder bumps 204 are disposed in the second receiving area B. Owing that the solder bumps 204 are not lower than the second inner wall 2066, when the solder bumps 204 are formed as bonding joints in the solder reflow process, the front surface 202a of the chip 202 can be electrically coupled to the second bottom 2068 of the substrate 206 via the solder bumps 204.

In addition, a gap d is formed between the sidewall of the chip 202, and the first inner wall 2062. As shown in FIG. 3, a buffer area C is formed among the sidewall of the chip 202, the first inner wall 2062, and a part of the first bottom 2064. The thickness of the chip 202 is preferred to be the same with the height of the first inner wall 2062.

The solder bumps 204 are not required to be covered by underfill materials. In the substrate structure of the invention, two sidewalls of the receiving area can help the solder bumps 204 to support the chip 202, thereby preventing the bonding joints damaged by stress, and improving the bonding strength of the chip 202 and the substrate 206. Therefore, the underfill process is not required in the region between the chip 202 and the substrate 206.

Figure 4:
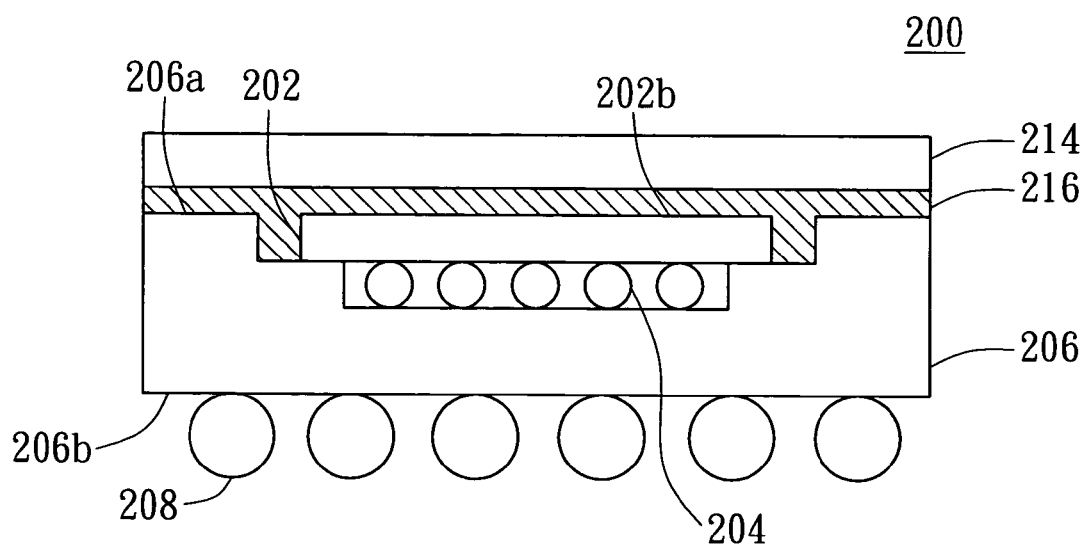
FIG. 4 is a schematic diagram of the flip chip package structure according to the first embodiment of the invention.

Referring to FIG. 4, a schematic diagram of the flip chip package structure according to the first embodiment of the invention is shown. The flip chip package structure includes the substrate 206, the chip 202, the solder bumps 204, a heat sink 214, a TIM 216, and solder balls 208. The flip chip structure in FIG. 4 is formed as the substrate structure having the chip 202 in FIG. 3 is combined with the heat sink 214. As shown in FIG. 4, the heat sink 214 is attached to the upper surface 206a and the back surface 202b of the chip 202 through the adhesion of the TIM 216. Several solder balls 208 are disposed on the lower surface 206b of the substrate 206. Moreover, in FIG. 3, the gap d is formed between the sidewall of the chip 202 and the first inner wall 2062, and the buffer area C formed thereby is also filled with the TIM 216. Such design can avoid the chip crack due to the extrusion between the chip 202 and the substrate 206 as the flip chip package structure expands at high temperature. The TIM 216 is preferred to be silica gel in order to reduce the stress more effectively.

Figure 5:
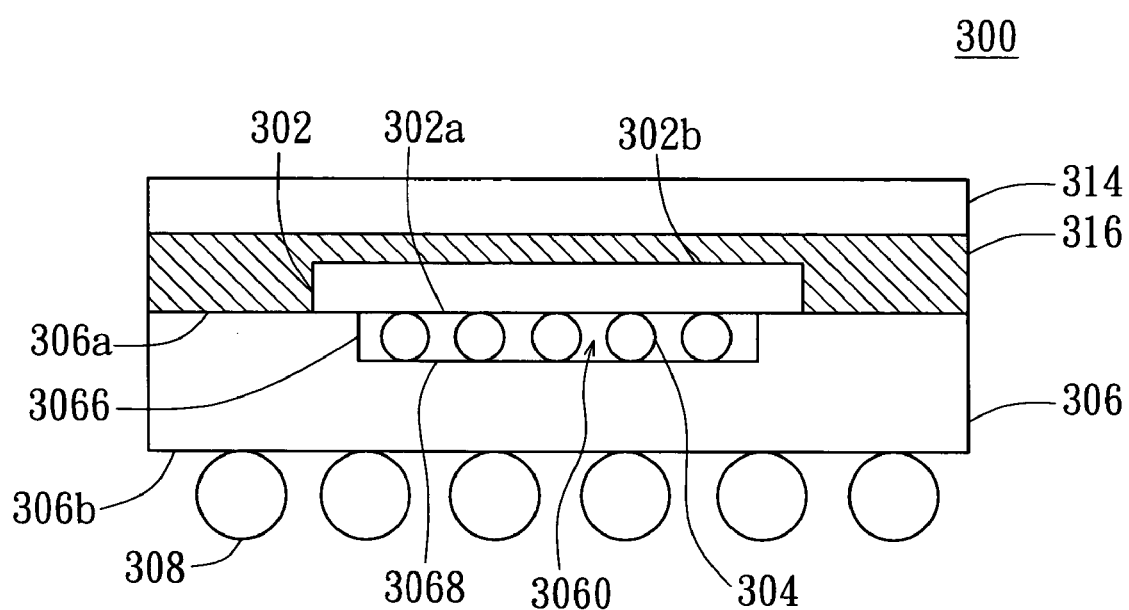
FIG. 5 is a schematic diagram of the flip chip package structure according to the second embodiment of the invention.

Referring to FIG. 5, a schematic diagram of the flip chip package structure according to the second embodiment of the invention is shown. The flip chip package structure 300 includes a substrate 306 having a receiving area 3060, a chip 302, solder bumps 304, a heat sink 314, a TIM 316, and solder balls 308. The receiving area 3060 has a bottom 3065, and an opening formed on the upper surface 306a. The chip 302 is disposed on the upper surface 306a of the substrate 306 and covers the opening. Meanwhile, several solder bumps 304 are disposed on the upper surface 306a of the substrate 306. When the chip 302 is disposed on the substrate 306, the solder bumps 304 are disposed in the receiving area 3060. The solder bumps 304 are not lower than the inner wall 3066, so the front surface 302a of the chip 302 can be electrically coupled to the bottom 3068 of the substrate 306 via the solder bumps 304 as the solder bumps are formed as bonding joints in the solder reflow process. The beat sink 314 is attached to the upper surface 306a of the substrate 306 and the back surface 302b of the chip 302 through the adhesion of the TIM 316, and several solder balls 308 are disposed on the lower surface 306b of the substrate 306.

In this embodiment, the solder bumps 304 are also not needed to be covered by underfill materials. In the improved design of the substrate structure, the sidewalls of the receiving area help the solder bumps to support the chip, so it can be prevented that the bonding joints are damaged by the stress and the bonding strength of the chip 302 and the substrate 306 can be enhanced. Therefore, the underfill process between the chip 302 and the substrate 306 in the prior art is not required any more.

The flip chip package structure disclosed in the embodiment of the invention mentioned above can improve the bonding strength of the chip and the substrate by using the substrate structure having the receiving area to help the solder bumps to support the chip. Therefore, not only the cost of the underfill equipment and materials in the underfill process can be saved, but also the manufacturing process can be shortened and the production performance can be improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A flip chip package structure, comprising:
a chip having a front surface and a back surface;
a plurality of solder bumps disposed on a front surface of the chip;
a substrate, having an upper surface and a lower surface, the substrate further comprising:
a first receiving area, formed at the upper surface and having a first inner wall and a first bottom, for receiving the chip; and
a second receiving area, formed at the first bottom, and having a second inner wall and a second bottom, for receiving the plurality of solder bumps which electrically couple the chip with the substrate;
wherein the front surface of the chip, the second inner wall, and the second bottom define a space between the chip and the substrate;
a heat sink, disposed over the upper surface of the substrate and a back surface of the chip; and
a thermal interface material (TIM), adhered the heat sink to the upper surface of the substrate and the back surface of the chip.

2. The flip chip package structure according to claim 1, wherein the chip covers the second receiving area.

3. The flip chip package structure according to claim 2, further comprising a gap formed between the sidewall of the chip and the first inner wall.

4. The flip chip package structure according to claim 2, further comprising a buffer area formed among the sidewall of the chip, the first inner wall, and a part of the first bottom.

5. The flip chip package structure according to claim 4, wherein the buffer area is filled with the TIM.

6. The flip chip package structure according to claim 1, wherein the thickness of the chip is substantially the same with the height of the first inner wall.

7. The flip chip package structure according to claim 1, wherein a height of each solder bump is at least the same with a height of the second inner wall.

8. The flip chip package structure according to claim 1, wherein a height of each solder bump is larger than a height of the second inner wall.

9. The flip chip package structure according to claim 1, further comprising a plurality of solder balls, disposed an the lower surface of the substrate.

10. A substrate structure of a flip chip package structure, comprising:
   an upper surface;
   a lower surface, corresponding to the upper surface in location;
   a first receiving area, for containing a chip, wherein the first receiving area, formed at the upper surface, has a first inner wall and a first bottom; and
   a second receiving area, for containing a plurality of solder bumps, wherein the second receiving area, formed at the first bottom, has a second inner wall and a second bottom,
   wherein a front surface of the chip, the second inner wall, and the second bottom define a space between the chip and the substrate.

11. The substrate structure according to claim 10, wherein the front surface of the chip is electrically coupled to the second bottom via the plurality of solder bumps.

12. The substrate structure according to claim 11, further comprising a gap formed between the sidewall of the chip and the first inner wall.

13. The substrate structure according to claim 11, further comprising a buffer area formed among the sidewall of the chip, the first inner wall, and a part of the first bottom.

14. The substrate structure according to claim 10, wherein the chip covers the second receiving area.

15. The substrate structure according to claim 10, wherein the thickness of the chip is substantially the same with the height of the first inner wall.

* * * * *